(12) United States Patent
Fai

(10) Patent No.: US 8,645,770 B2
(45) Date of Patent: Feb. 4, 2014

(54) SYSTEMS AND METHODS FOR PROACTIVELY REFRESHING NONVOLATILE MEMORY

(75) Inventor: Anthony Fai, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 101 days.

(21) Appl. No.: 13/352,998

(22) Filed: Jan. 18, 2012

(65) Prior Publication Data
US 2013/0185606 A1 Jul. 18, 2013

(51) Int. Cl.
*G06F 11/16* (2006.01)
*G11C 29/00* (2006.01)

(52) U.S. Cl.
USPC .......................................... 714/704; 714/763

(58) Field of Classification Search
USPC ................... 714/704, 763; 365/222
See application file for complete search history.

(56) References Cited

U.S. PATENT DOCUMENTS

| | | | |
|---|---|---|---|
| 7,535,787 B2 * | 5/2009 | Elmhurst et al. | 365/222 |
| 7,793,172 B2 * | 9/2010 | Bruce et al. | 714/708 |
| 8,164,967 B2 | 4/2012 | Byom et al. | |
| 8,201,053 B2 * | 6/2012 | Aasheim et al. | 714/763 |
| 8,214,700 B2 * | 7/2012 | Chen | 714/721 |
| 8,281,220 B2 * | 10/2012 | Kitahara | 714/764 |
| 8,355,291 B2 * | 1/2013 | Kim et al. | 365/222 |
| 8,397,100 B2 * | 3/2013 | Blackmon et al. | 714/6.1 |
| 8,423,866 B2 * | 4/2013 | Dusija et al. | 714/773 |
| 8,462,550 B2 * | 6/2013 | Cornwell et al. | 365/185.03 |

* cited by examiner

*Primary Examiner* — James C Kerveros
(74) *Attorney, Agent, or Firm* — Van Court & Aldridge LLP (57) ABSTRACT

System and methods for proactively refreshing portions of a nonvolatile memory including a memory system that proactively refreshes a portion of nonvolatile memory based on data associated with the portion. The data may include the time elapsed since the portion was last refreshed, the number of times the portion has been cycled, and the average operating temperature of the nonvolatile memory. A portion of nonvolatile memory, when meeting certain criteria determined from the data, may be proactively refreshed during a downtime when the nonvolatile memory is not otherwise being accessed.

15 Claims, 5 Drawing Sheets

FIG. 1

| | Address | #Cycles | Temp | Time Lapsed | Expected BER | Critical | Valid |
|---|---|---|---|---|---|---|---|
| 220a | 0x2E5024A5 | 9493 | 55C | 768527 | 110 | | y |
| 220b | 0x1E8289A1 | 9915 | 55C | 375151 | 87 | | y |
| | 0x1B4EA095 | 5006 | 55C | 822873 | 85 | y | y |
| | 0x273EC9A7 | 6990 | 55C | 473694 | 75 | y | y |
| | 0x26171E3D | 7008 | 55C | 423256 | 72 | | y |
| | 0x2DDAEDD7 | 4579 | 55C | 564105 | 65 | | y |
| | 0x1612D8CD | 4811 | 55C | 525053 | 64 | | y |
| | 0x28AF9C42 | 5908 | 55C | 309104 | 58 | y | y |
| | 0x35D2B46 | 7803 | 55C | 7621 | 50 | | y |
| | 0x29635BC8 | 1289 | 55C | 614889 | 48 | | y |
| | 0x24EBB518 | 6470 | 55C | 31945 | 43 | | y |
| | 0x142D62F5 | 3661 | 55C | 117524 | 31 | | y |
| | 0x7CDEA94 | 282 | 55C | 434732 | 30 | y | y |
| | ... | ... | | | ... | ... | ... |
| 220(n-1) | 0x1DCFB971 | 2845 | | | | | n |
| 220n | 0x1AC68219 | 2855 | | | | | n |

SYSTEMS AND METHODS FOR PROACTIVELY REFRESHING NONVOLATILE MEMORY

BACKGROUND

This document relates to memory systems that proactively refresh portions of a nonvolatile memory.

Various types of nonvolatile memory (NVM), such as flash memory (e.g., NAND flash memory and NOR flash memory), can be used for mass storage. For example, consumer electronics (e.g., portable media players) use flash memory to store data, including music, videos, images, and other media or types of information.

Portions of a nonvolatile memory can be refreshed periodically to prevent latency and data integrity issues. A portion is typically refreshed only after a host system encounters an error reading from or writing to the portion. When such an error is found, error correction algorithms must be applied to the portion before the read or write operation can be completed, which introduce additional latency into the system. What are needed are systems and methods for proactively refreshing nonvolatile memory.

SUMMARY

Systems and methods for proactively refreshing nonvolatile memory are disclosed. Portions of nonvolatile memory (e.g., one or more pages or blocks in a NAND flash memory) can be refreshed periodically to prevent latency and data integrity issues associated with, for example, degradation in the quality of data stored in a portion of nonvolatile with time and usage. Errors in the data may be corrected through the use of Error Checking and Correction (ECC) code; however, as the number of errors in the portion increases, the time required to correct the errors also increases. The time rewired to correct the errors introduces additional time lag, or latency, to each memory operation. Additionally, each ECC algorithm has a limit to the number of errors it can correct. In some embodiments, the portion can be refreshed (e.g., reprogrammed in another physical location in the nonvolatile memory) when the number of errors detected in a portion of nonvolatile memory reaches a certain threshold. Failure to refresh a portion of nonvolatile memory before its error rate exceeds the capability of the ECC may result in permanent data loss.

According to some embodiments, a host device can keep track of critical characteristics that adversely affect the quality of data stored in a portion of a nonvolatile memory. For example, the host device may keep track of the time elapsed since the portion was last programmed, the total number of cycles (erasing and programming) the portion has experienced, and the average operating temperature of the nonvolatile memory. Those characteristics, among others, may be used to determine an expected error rate ("EER") for the memory portion. When the EER for a particular portion of the nonvolatile memory exceeds a predetermined value, the portion can be proactively refreshed. As used herein, "proactive refresh" refers to reprogramming a portion of a nonvolatile memory in another physical location upon reaching an EER threshold. The refresh operation can be considered proactive because it is completed before the portion of a nonvolatile memory is accessed for another operation (e.g., read, write, or erase).

In some embodiments, portions of a nonvolatile memory can be queued for proactive refresh. The queue may be stored in a memory (e.g., a DRAM) residing on the host device. Portions of the nonvolatile memory with higher EERs may be at the top of the queue. Other considerations, including the importance of the data stored in the portion, may be accounted for in determining which portions to refresh first. Proactive refresh operations can be scheduled during downtimes (e.g., when the nonvolatile memory is not being read, written, or erased) so that memory operations are not affected by the refresh process, resulting in reduced latency.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION

Figure 1:
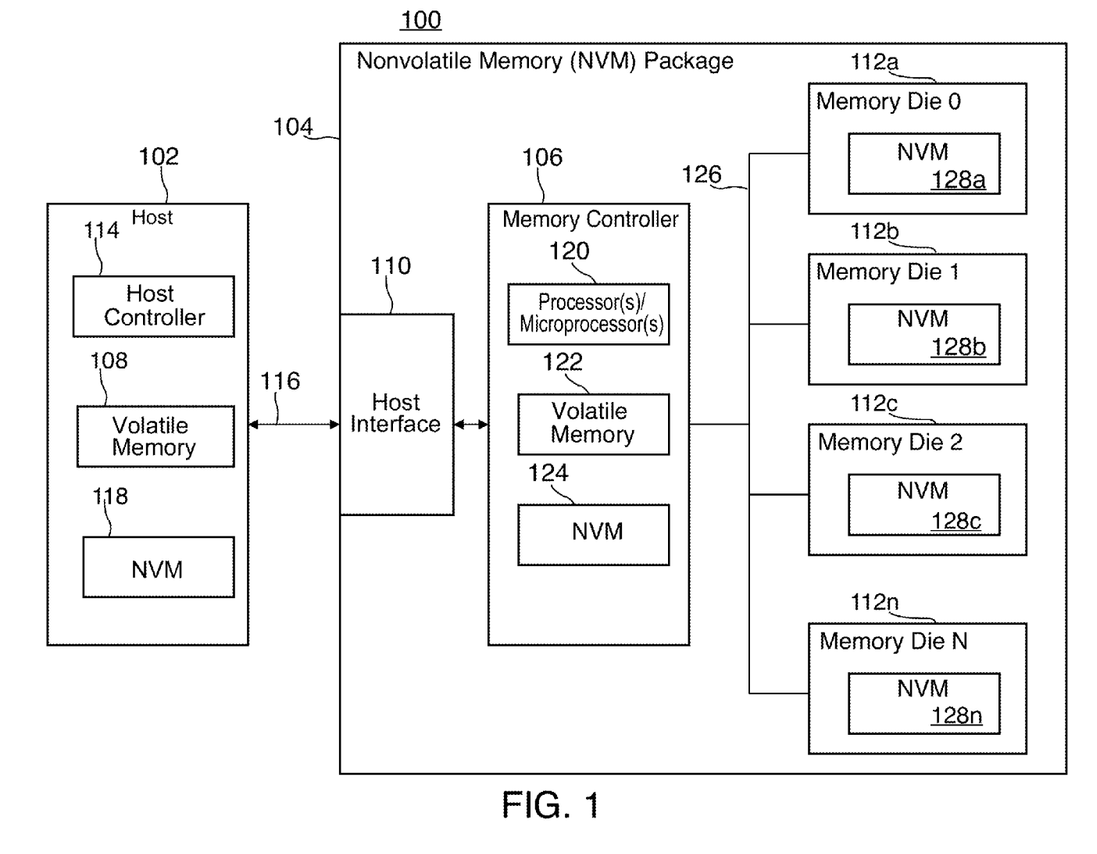
FIG. 1 is a diagram depicting an example system that includes a host and an NVM package with a memory controller.

FIG. 1 is a diagram depicting system 100 that includes host 102 and NVM package 104, which includes memory controller 106, host interface 110, and memory dies 112a-n.

Host 102 can be any of a variety of host devices and/or systems, such as a portable media player, a cellular telephone, a pocket-sized personal computer, a personal digital assistant (PDA), a desktop computer, a laptop computer, and/or a tablet computing device. NVM package 104 includes NVM (e.g., in the memory dies 112a-n) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104 to cause NVM package 104 to perform various operations, such as read, write, and erase operations. Host controller 114 can include one or more processors and/or microprocessors that are configured to perform operations based on the execution of software and/or firmware instructions. Additionally and/or alternatively, host controller 114 can include hardware-based components, such as application-specific integrated circuits ("ASICs"), that are configured to perform various operations. Host controller 114 can format information (e.g., commands, data) transmitted to NVM package 104 according to a communications protocol shared between host 102 and NVM package 104.

Host 102 can also include volatile memory 108 and NVM 118. Volatile memory 108 can be any of a variety of volatile memory types, such as cache memory or RAM. Host device 102 can use volatile memory 108 to perform memory operations and/or to temporarily store data that is being read from and/or written to NVM package 104. For example, volatile memory 122 can store a database of information about portions (e.g., pages of a NAND flash memory) of NVMs 128a-128n. The database can store an entry for each portion that may include, without limitation, the number of cycles (e.g., times that portion has been programmed and erased), the average operating temperature of NVM package 104, the time elapsed since the last time that portion was programmed, and flags to indicate whether the data stored in the portion is critical and/or valid. Host device 102 can use NVM 118 to persistently store a variety of information, including the database of information about portions of NVMs 128a-n even when host device 102 is turned off. Alternatively, the database of information about portions of NVMs 128a-n may be transferred to NVM package 104 for persistent storage when host 102 is shutdown.

Host controller 114 can use the information stored in the database in volatile memory 108 to calculate an EER for each valid portion of nonvolatile memory in NVMs 128a-n in NVM package 104. For example, EERs may be expected to increase with the number of erase/program cycles, average temperature, and time elapsed since the last time the portion of nonvolatile memory was programmed. If the EER for a particular portion of nonvolatile memory in NVMs 128a-n exceeds a predetermined threshold value, host controller 114 may provide a command to NVM package 104 to refresh that portion of nonvolatile memory. In some embodiments, host controller 114 can update the database each time it issues a command that affects the information stored therein. Updating the database will be discussed in more detail below with reference to FIG. 2.

According to some embodiments, host controller 114 can have control over when proactive refresh will occur. In those embodiments, NVM package 104 can request permission to refresh a portion of nonvolatile memory by sending an interrupt to host controller 114. Host controller 114 can determine whether to permit or deny the refresh request based on, for example, anticipated activity (e.g., access requests and/or data transfer).

Host 102 can communicate with NVM package 104 over communication channel 116. The communication channel 116 between host 102 and NVM package 104 can be fixed (e.g., fixed communications channel), detachable (e.g., universal serial bus (USB), serial advanced technology (SATA)), or wireless (e.g., Bluetooth™). Interactions with NVM package 104 can include providing commands (e.g., read, write, or erase) and transmitting data, such as data to be written to one or more of memory dies 112a-n, to NVM package 104. Communication over communication channel 116 can be received at host interface 110 of NVM package 104. Host interface 110 can be part of and/or communicatively connected to memory controller 106.

NVM package 104 can interact with host 102 over communication channel 116 using host interface 110 and memory controller 106. Like host controller 114, memory controller 106 can include one or more processors and/or microprocessors 120 that are configured to perform operations based on the execution of software and/or firmware instructions. Additionally and/or alternatively, memory controller 106 can include hardware-based components, such as ASICs, that are configured to perform various operations. Memory controller 106 can perform a variety of operations, such as performing memory operations requested by host 102.

Host controller 114 and memory controller 106, alone or in combination, can perform various memory management functions, such as error correction and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

Memory controller 106 can include volatile memory 122 and NVM 124. Volatile memory 122 can be any of a variety of volatile memory types, such as cache memory or RAM. Memory controller 106 can use volatile memory 122 to perform memory operations and/or to temporarily store data that is being read from and/or written to NVM in memory dies 112a-n. For example, volatile memory 122 can store firmware and use the firmware to perform operations on NVM package 104 (e.g., read/write operations). Memory controller 106 can use NVM 124 to persistently store a variety of information, such as debug logs, instructions and firmware that NVM package 104 uses to operate.

Memory controller 106 uses a shared internal bus 126 to access NVM used for persistent data storage. In system 100 that NVM is depicted as NVMs 128a-n, which are incorporated into memory dies 112a-n. Memory dies 112a-n can be, for example, integrated circuit (IC) dies. Although only the single shared bus 126 is depicted in NVM package 104, an NVM package can include more than one shared internal bus. Each internal bus can be connected to multiple memory dies (e.g., 2, 3, 4, 8, 32, etc.), as depicted with regard memory dies 112a-n. Memory dies 112a-n can be physically arranged in a variety of configurations, including a stacked configuration. NVMs 128a-n can be any of a variety of NVMs, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof. Memory controller 106 can perform various operations (e.g., read/write operations) on NVMs 128a-n.

In some embodiments, as in the embodiments depicted in FIG. 1, memory controller 106 can be incorporated into the same package as memory dies 112a-n; however, that need not be the case. Memory controller 106 may be physically located in a separate package or in the same package as host 102. In some embodiments, memory controller 106 may omitted, and all memory operations (e.g., data whitening, garbage collection, ECC, and wear leveling) can be performed by a host controller (e.g., host controller 114). NVM package 104 may also, in some embodiments, represent a Solid-State Drive ("SSD"). In those embodiments, memory controller 106 may be configured to perform all memory management functions for the SSD.

Figure 2:
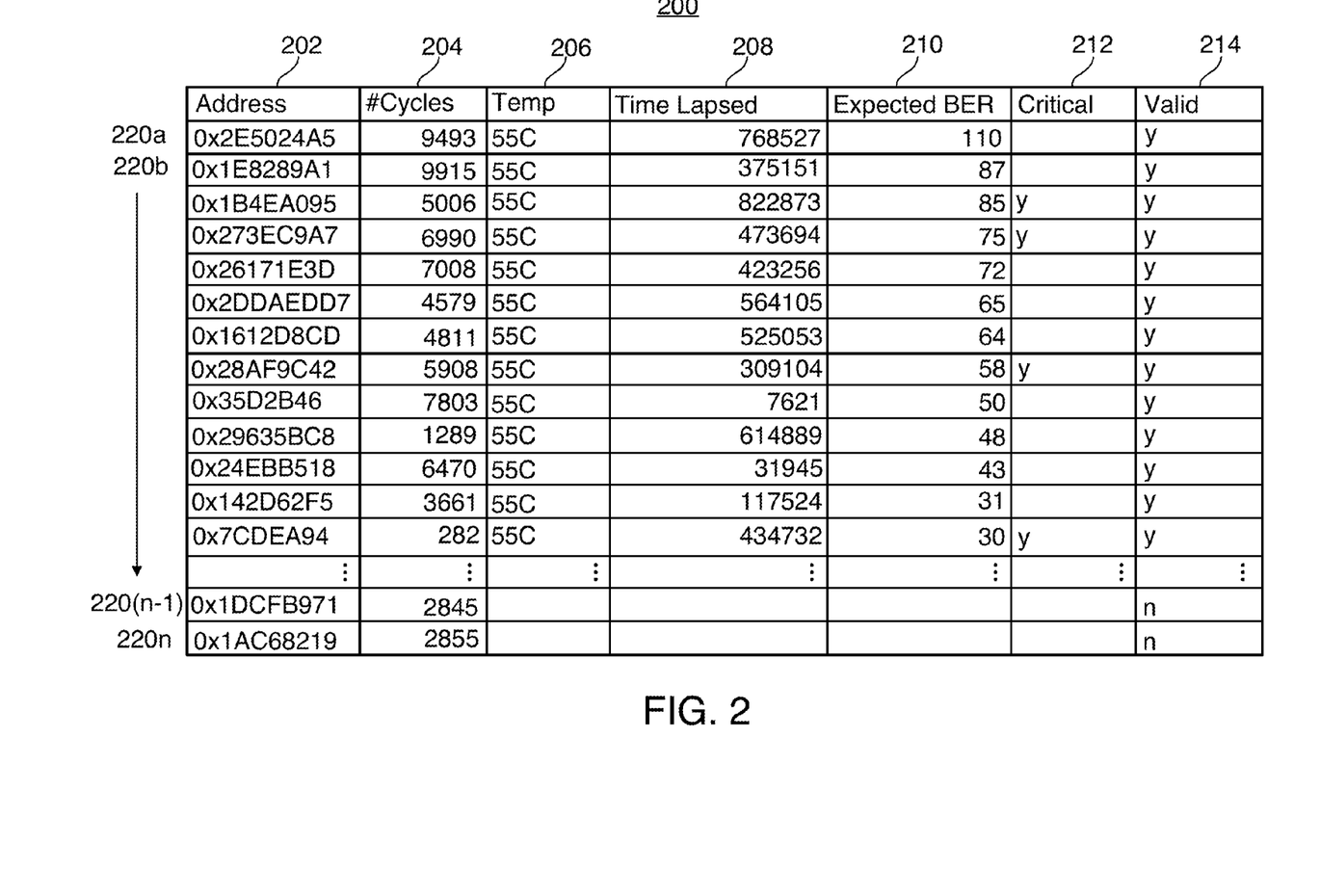
FIG. 2 is an example of a database containing information about portions of a nonvolatile memory.

FIG. 2 shows an example of a database 200 of information about portions of a nonvolatile memory. Each portion may be represented in entries 220a-n. Each entry 220a-n of database 200 may include, without limitation, data fields representing the address 202 of a portion of a nonvolatile memory, the number of cycles 204 (e.g., erase and program cycles) that the portion has experienced, the average operating temperature 206 of the nonvolatile memory, the time elapsed 208 since the last time the portion was programmed, EER 210, critical flag 212, and valid flag 214. Address 202 may be the logical and/or physical address of a portion of nonvolatile memory. For example, address 202 can be a pointer to the first bit of a page or block of NAND flash memory.

Time elapsed 208 for a particular portion of nonvolatile memory can be tracked with reference to either a logical or physical address. Because time elapsed 208 refers to the time that has passed since a particular portion has been programmed, the physical and logical addresses for that portion will not change until that portion is refreshed to another physical location, at which time the time elapsed counter will begin again. Time elapsed 208 may be determined, for example, with reference to a real-time clock ("RTC") included in a host device (e.g., host device 102 of FIG. 1). Cycles 204 requires a physical address because it tracks the number of times a physical portion of nonvolatile memory has been cycled (i.e., erased and programmed). Therefore, the physical address of the portion of nonvolatile memory can be communicated from memory controller 106 back to host device 102 over communication channel 116. Temperature 206 may be constant for all portions of the nonvolatile memory because it refers to the nonvolatile memory's average operating temperature. In other embodiments, the average temperature can be tracked for each memory die (e.g., each memory die of memory dies 112a-n of FIG. 1). For example, the average operating temperature of memory die 112a can be tracked separately from the average operating temperature of memory die 112b.

Database 200 can be updated in response to operations issued by the host device to an NVM package. For example, host controller 114 of host device 102 can issue a command to write data to a portion of nonvolatile memory. Host controller 114 can update database 200 with the logical and/or physical address 202 that the data was written to. Time elapsed 208 can also be reset to indicate that the portion of nonvolatile memory at address 202 was programmed (e.g., written to) recently. In some embodiments, time elapsed 208 may keep a running total of the actual time elapsed since the portion of nonvolatile memory was last programmed. In other embodiments, time elapsed 208 might only hold a timestamp, indicating the date and time that the portion was last programmed.

As another example, host controller 114 may issue a command to erase a portion of nonvolatile memory. An erase command may be provided in response to a user of host device 102 requesting that some data stored in the nonvolatile memory be deleted, as part of a wear leveling process, or for any other suitable reason. Once a portion of nonvolatile memory is erased, it may not be important to keep track of time elapsed 208 since the last programming because that portion will not be read again until it is reprogrammed, so refreshing the portion would provide no benefit. In that case, the portion of nonvolatile memory may be marked as invalid by toggling valid flag 214, and time elapsed 208 can be updated with a suitable flag (e.g., tagged or erased) to indicate that the portion of nonvolatile memory at address 202 should not be refreshed.

In some embodiments, for all valid portions (e.g., portions that have been programmed and not erased) of nonvolatile memory, database 200 can represent a refresh queue. A refresh queue may prioritize portions of a nonvolatile memory for proactive refresh based on the data stored in database 200. The order of the refresh queue may be determined based upon EER 210 that can be calculated as a function of cycles 204, temperature 206, and time elapsed 208. Details of the calculation of an EER 210 are described in further detail with respect to FIG. 3 below.

In some embodiments, certain critical data in portions of a nonvolatile memory may be prioritized for refresh ahead of other non-critical data. For example, some portions of nonvolatile memory (e.g., executable code or file system data) may need to be read very frequently. Avoiding using ECC as much as possible for these portions of nonvolatile memory may provide significant performance benefits. Moreover, early refresh for critical data may prevent catastrophic failure of the nonvolatile memory. Portions of nonvolatile memory that contain critical data can be tagged in any suitable way (e.g., by toggling critical flag 212).

Figure 3:
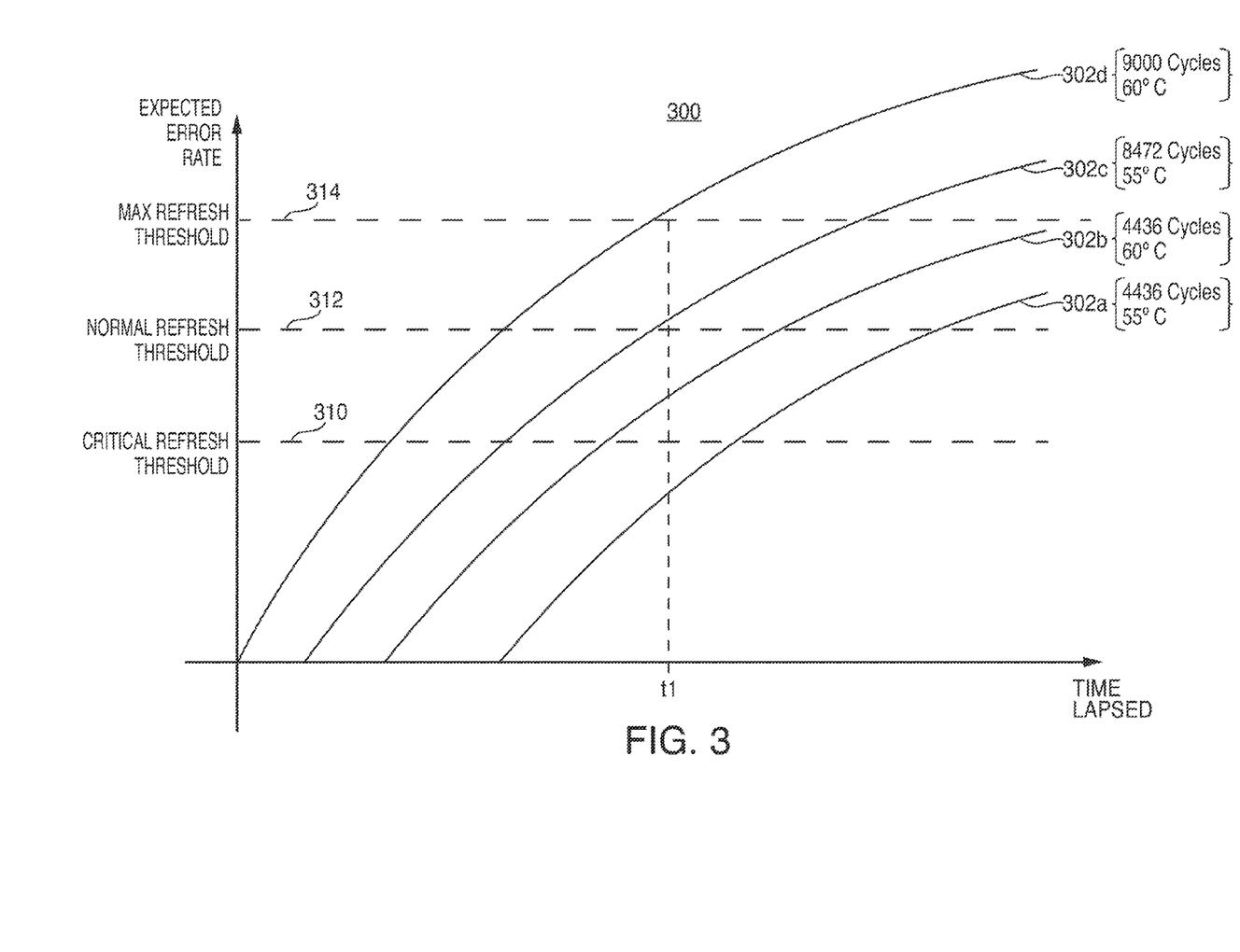
FIG. 3 is a graph depicting exemplary EER curves.

FIG. 3 is a graph 300 depicting exemplary EER curves 302a-d for a portion of nonvolatile memory. The EER is represented on the y-axis of graph 300 and the time elapsed since the last time that portion was programmed is represented on the x-axis. Each EER curve 302a-d represents the EER over time for a given number of cycles and average operating temperature. In general, an EER curve will shift up on graph 300 in response to an increased number of cycles and/or a higher average operating temperature. For example, curve 302a might represent the EER over time for a portion of nonvolatile memory that has been through 4436 cycles at 55° C., curve 302b might represent the EER over time for a portion of nonvolatile memory that has been through 4436 cycles at 60° C., curve 302c might represent the EER over time for a portion of nonvolatile memory that has been through 8742 cycles at 55° C., and curve 302d might represent the EER over time for a portion of nonvolatile memory that has been through 9000 cycles at 60° C.

The EER for a particular portion of nonvolatile memory may be calculated by finding the intersection between the curve associated with the cycle and temperature characteristics for that portion of nonvolatile memory and the time elapsed since the portion was last programmed. For example, EER 304 is the EER for a portion on nonvolatile memory that has been cycled 4436 times with an average temperature of 55° C. at time $t_1$.

Each memory die in an NVM package may have its own characteristic set of EER curves based on a number of factors, including manufacturing tolerances and whether the NVM uses single-level cells ("SLC") or multi-level cells ("MLC"). In some embodiments, the NVM manufacturer may provide EER characteristics. In other embodiments, each memory die can be characterized individually as part of an initialization process or periodically throughout the life of the NVM, for example. The EER characteristics may be stored on either the host NVM (e.g., NVM 118 of FIG. 1) or the NVM in the NVM package (e.g., NVM 128a-n of FIG. 1). In some embodiments, the system may store and manage EER characteristics for a variety of different NVMS. Upon system startup, the host controller can determine which NVM is present and determine which EER characteristics to apply.

Graph 300 can include a number of EER thresholds that control when a host controller will issue a command to proactively refresh a portion of nonvolatile memory. Portions of nonvolatile memory should not be refreshed too often because the additional cycling may reduce the useful lifetime of the nonvolatile memory. Therefore, using thresholds to determine when a portion of nonvolatile memory should be refreshed may help to optimally balance performance (e.g., improved latency) and useful life of the nonvolatile memory. In some embodiments, graph 300 can include critical EER refresh threshold 310, normal EER refresh threshold 312, and EER Max threshold 314. Critical EER refresh threshold 310 may be the EER level at which a page that has been tagged as critical will be refreshed. Normal EER refresh threshold 312 may be the EER level at which a page that has not been tagged as critical will be refreshed.

In some embodiments, a portion of memory that reaches its appropriate EER refresh threshold (e.g., critical or normal) may not be refreshed immediately. For example, if a host device is interacting with the nonvolatile memory (e.g., reading to, writing from, or erasing a portion of a nonvolatile memory), the host device can postpone the refresh until the refresh operation can be completed without interfering with other memory operations. EER Max refresh threshold 314 can, according to some embodiments, be an EER threshold at which a portion of nonvolatile memory is immediately refreshed regardless of other concurrent memory operations. EER Max refresh threshold 314 may be, for example, set a predetermined amount lower than the EER at which ECC may no longer be able to correct errors in the portion of nonvolatile memory.

EERs may also, in some embodiments, be used to determine whether to use other memory assist techniques before refreshing a portion of nonvolatile memory. For example, if the expected EER for a particular portion is approaching, but has not reached its refresh threshold, the host controller may proactively employ a technique such as threshold voltage shifting to reduce read operation errors.

Figure 4:
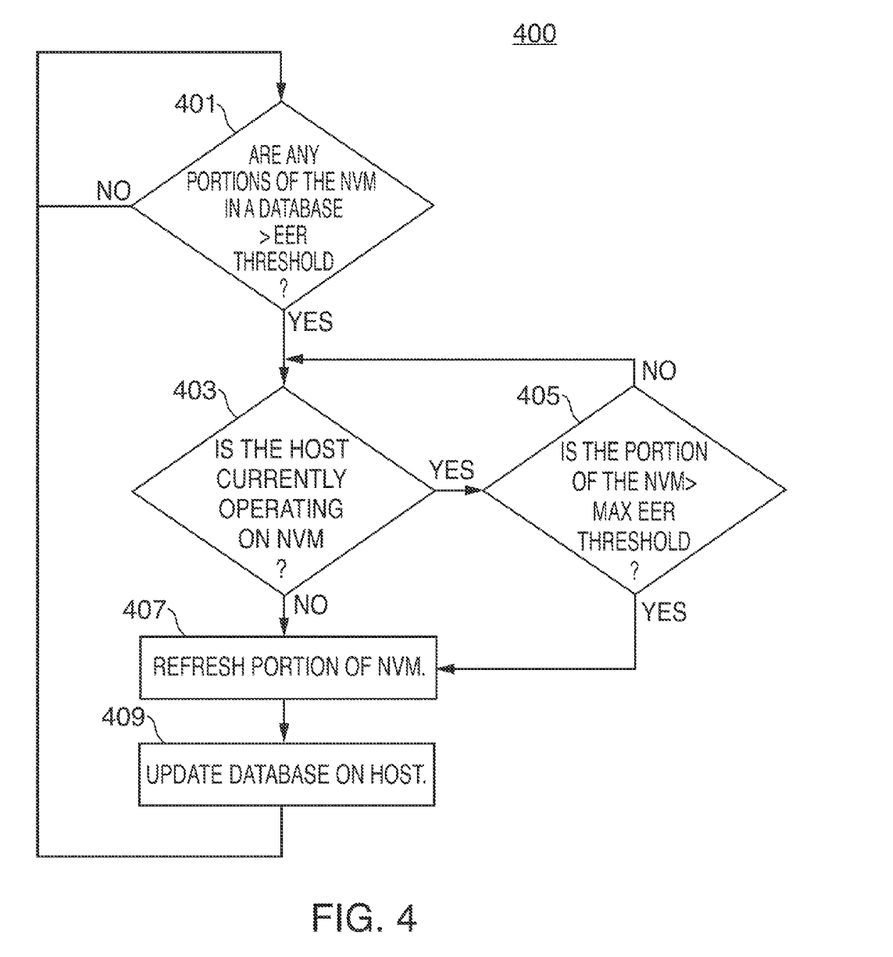
FIG. 4 is a flowchart depicting an example process for proactively refreshing a portion of an NVM.

FIG. 4 is a flowchart depicting an example process 400 for proactively refreshing a portion of an NVM. Process 400 begins at step 401 in which a controller can determine whether any portions of an NVM are expected to have an EER higher than a predetermined threshold. For example, process 400 may include three different EER refresh thresholds, including a critical EER threshold, a normal EER refresh threshold, and an EER Max threshold. At step 401, a controller can compare a database of information about an NVM (e.g., database 200 of FIG. 2) with the EER refresh thresholds. If any portions of the NVM have an EER greater than the appropriate threshold (i.e., the critical EER refresh threshold for portions tagged as critical, the normal EER refresh threshold for portions not tagged as critical, or the EER Max refresh threshold for all portions) process 400 may proceed to step 403. Otherwise, process 400 can return to step 401.

At step 403, the controller can determine whether it is currently operating on the NVM. In particular, the controller can determine whether the NVM is currently being read, written to, erased, etc. If the controller is currently operating on the NVM, process 400 can proceed to step 405 in which the controller can determine whether an EER Max refresh threshold has been exceeded. If so, process 400 can interrupt the currently running operation(s) and proceed to step 407 in which the portion of the NVM can be refreshed. If, at step 405, the portion does not exceed an EER Max refresh threshold, process 400 can return to step 403. Steps 403 and 405 can loop until either the controller is no longer operating on the NVM, or a portion of the NVM exceeds the EER Max refresh threshold.

If the controller is not operating in the NVM at step 403, process 400 can proceed to step 407 in which the portion of the NVM is refreshed. After the portion is refreshed at step 407, the database (e.g., database 200) can be updated on the host. For example, the database entry that previously referenced the refreshed portion of the NVM can be tagged as invalid in the database. The new physical address for the refreshed portion may be sent back to the host. The number of cycles associated with that physical location in the database may be incremented by one and the time elapsed field may be reset to indicate that the portion was reprogrammed. Process 400 may then return to step 401.

Figure 5:
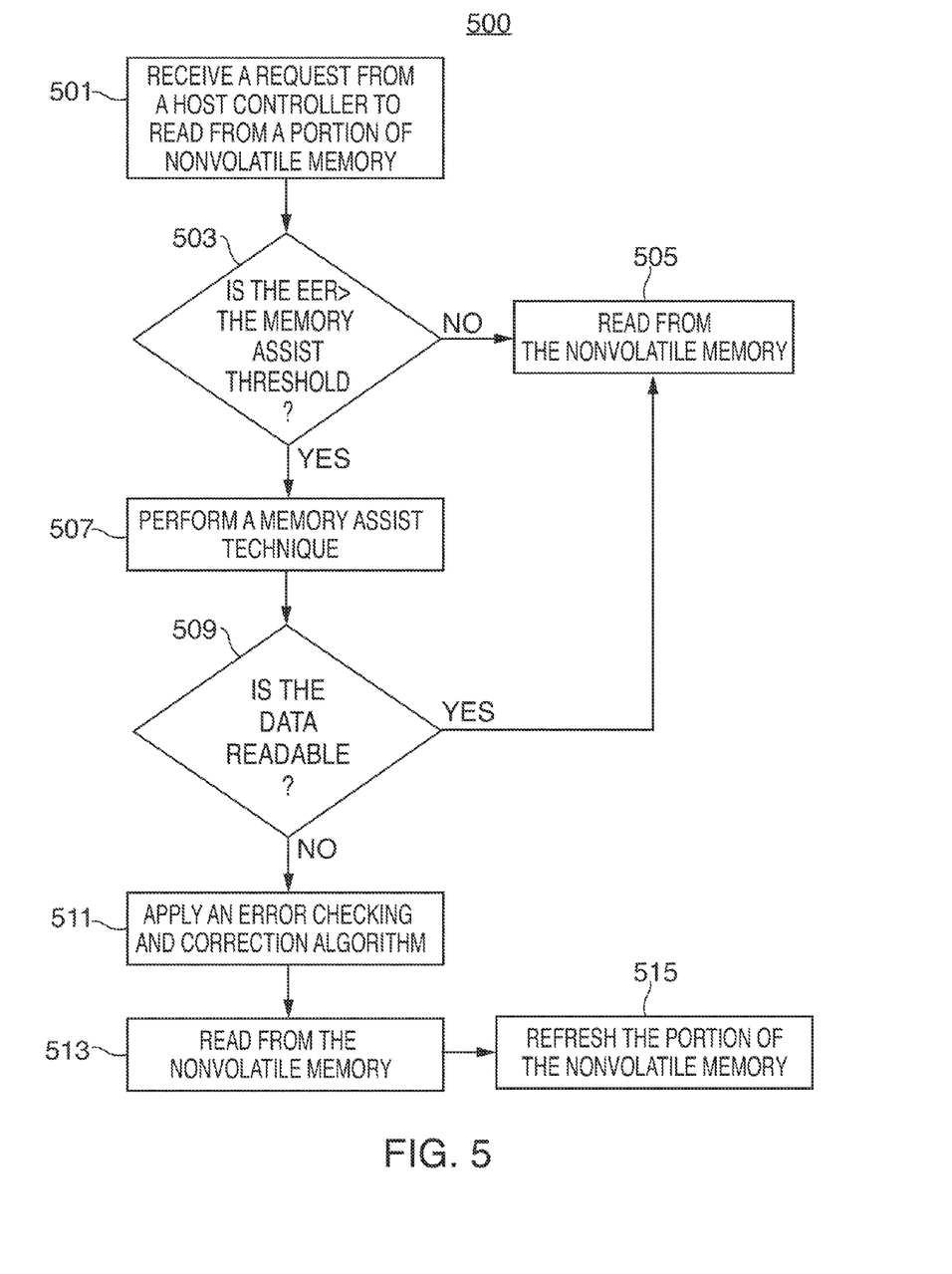
FIG. 5 is a flowchart depicting an example process for proactively refreshing a portion of an NVM.

FIG. 5 is a flowchart depicting an example process 500 for proactively refreshing a portion of an NVM. Process 500 begins at step 501 at which a nonvolatile memory receives a read request from a host controller (e.g., host controller 114 of FIG. 1). At step 503, the host controller can determine whether the portion of nonvolatile memory it is attempting to read from has an EER higher than a predetermined memory assist threshold (e.g., by referencing a database, such as database 200 of FIG. 2). A memory assist threshold may, according to some embodiments, be set lower than a refresh threshold, such that a portion of nonvolatile memory will reach a memory assist threshold before reaching a refresh threshold.

If the EER for the portion of nonvolatile memory is lower than the memory assist threshold, the read operation can be carried out at step 505.

However, if the EER for the portion is higher than the memory assist threshold, the host controller can proactively initiate a memory assist technique. For example, the threshold voltage of the transistor of a flash memory cell may shift in a predictable way with time and use. The host controller may, by reference to the data in a database (e.g., database 200) determine how much the threshold voltage was likely to have shifted, and alter its read operation accordingly using a process known as threshold voltage shifting. If the data is readable at step 509 after the memory assist technique is performed (i.e., there are no errors in the portion of nonvolatile memory), the process can proceed to step 505 in which the read operation can be carried out.

If, at step 509, the data in the portion of nonvolatile memory is still unreadable after the memory assist technique was applied, an error checking and correction algorithm can be applied at step 511. The ECC can check for and fix errors found in the portion of nonvolatile memory. The read operation can proceed at step 513. Next, because the portion is known to be prone to errors, the data may, in some embodiments, be refreshed at step 515.

It is to be understood that the steps shown in processes 400 and 500 of FIGS. 4 and 5 are merely illustrative and that existing steps may be modified or omitted, additional steps may be added, and the order of certain steps may be altered.

While there have been described systems and methods for proactively refreshing nonvolatile memory, it is to be understood that many changes may be made therein without departing from the spirit and scope of the invention. Insubstantial changes from the claimed subject matter as viewed by a person with ordinary skill in the art, no known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. A system for proactively refreshing portions of a nonvolatile memory, comprising:
a nonvolatile memory comprising a plurality of portions;
a memory controller communicatively coupled to the nonvolatile memory over a first bus; and
a host interface through which the memory controller communicates with a host controller of a host device over a second bus, wherein portions of the nonvolatile memory are proactively refreshed based at least on an expected bit error rate calculated using data stored on the host controller,
wherein the data stored on the host controller comprises:
a time elapsed since the portion of nonvolatile memory was last programmed, wherein the time elapsed is determined with reference to a real-time clock resident on the host device:
a number of times that the portion has been cycled; and
an average operating temperature of the nonvolatile memory.

2. The system of claim 1, wherein each portion of the plurality of portions of the nonvolatile memory is a block comprising a plurality of pages.

3. The system of claim 1, wherein each portion of the plurality of portions of the nonvolatile memory is an individual page.

4. The system of claim 1, wherein the data stored on the host controller is transferred to the nonvolatile memory when the host controller is shutdown.

5. The system of claim 1, wherein the nonvolatile memory comprises NAND flash memory.

6. A method for proactively refreshing a portion of a nonvolatile memory, comprising:
   determining whether a block of nonvolatile memory has an expected error rate higher than a predetermined refresh threshold;
   determining whether a host controller of a host device is in an idle state; and
   refreshing the block of the nonvolatile memory when it is determined that the block has an expected error rate higher than a predetermined refresh threshold, and the nonvolatile memory is in an idle state, wherein the expected error rate is calculated based on time elapsed since the block was last programmed, a number of times the block has been cycled, and an average operating temperature of the nonvolatile memory.

7. The method of claim 6, wherein refreshing the portion of nonvolatile memory comprises copying the contents of the portion from a first physical location of the nonvolatile memory to a second physical location of the nonvolatile memory.

8. The method of claim 7, further comprising updating a database stored on the host device.

9. The method of claim 7, further comprising transferring the database stored on the host device to the nonvolatile memory when the host controller is shutdown.

10. The method of claim 8, wherein updating the database comprises:
    tagging the portion of nonvolatile memory at the first physical location as invalid;
    incrementing a number of cycles associated with the portion of nonvolatile memory at the second physical location; and
    resetting a time elapsed field associated with the portion of nonvolatile memory at the second physical location.

11. The method of claim 6, wherein determining whether a block of nonvolatile memory has an expected error rate higher than a predetermined refresh threshold is independent of any error code correction parameter associated with that block.

12. A method for proactively refreshing a portion of a nonvolatile memory, comprising:
    receiving, at the nonvolatile memory, a request from a host controller of a host device to read from the portion of the nonvolatile memory;
    determining whether the portion of the nonvolatile memory has an expected error rate above a predetermined memory assist threshold, wherein the expected error rate is calculated based on time elapsed since the portion was last programmed, a number of times the portion has been cycled, and an average operating temperature of the nonvolatile memory; and
    proactively performing a memory assist technique to read data from the portion of nonvolatile memory when it is determined that the expected error rate is higher than a predetermined refresh threshold.

13. The method of claim 12, further comprising:
    performing an error checking and correction algorithm to the portion of the nonvolatile memory;
    reading from the portion of the nonvolatile memory; and
    refreshing the portion of the nonvolatile memory.

14. The method of claim 12, wherein the memory assist technique comprises threshold voltage shifting.

15. A system comprising:
    a non-volatile memory package comprising a controller and a plurality of nand flash die; and
    a host device that is communicatively coupled to the non-volatile memory package via an interface, the host device comprising a database of parameters that characterize usage of the nand flash die, the parameters comprising a block cycle count for each block of each nand flash die, wherein the host device is operative to:
       obtain a temperature of the non-volatile memory package;
       calculate an expected error response for a block in one of the nand flash dies based on the obtained temperature and the block cycle count; and
       instruct the non-volatile memory package to refresh the block if the expected error response exceed a predetermined threshold, thereby pre-empting execution of an error correction event when the block is accessed for a memory operation.

* * * * *

UNITED STATES PATENT AND TRADEMARK OFFICE
CERTIFICATE OF CORRECTION

| | | |
|---|---|---|
| PATENT NO. | : 8,645,770 B2 | Page 1 of 1 |
| APPLICATION NO. | : 13/352998 | |
| DATED | : February 4, 2014 | |
| INVENTOR(S) | : Anthony Fai | |

It is certified that error appears in the above-identified patent and that said Letters Patent is hereby corrected as shown below:

Specification

In Column 1, Line 36, delete "rewired" and insert -- required --, therefor.

Claims

In Column 8, Line 58, Claim 1, delete "device:" and insert -- device; --, therefor.

Signed and Sealed this
Nineteenth Day of January, 2016

Michelle K. Lee
*Director of the United States Patent and Trademark Office*